United States Patent [19]
Wilson et al.

[11] Patent Number: 5,989,504
[45] Date of Patent: Nov. 23, 1999

[54] CHEMICAL PROCESS EMPLOYING CORROSION RESISTANT COMPOSITES

[75] Inventors: Doug Wilson, Laguna Beach; Raj Mathur, Huntington Beach; Gary Pruett, Cypress; Robert Howard Metter, Orange, all of Calif.

[73] Assignee: SGL Carbon Composites, Gardena, Calif.

[21] Appl. No.: 08/879,982

[22] Filed: Jun. 20, 1997

Related U.S. Application Data

[63] Continuation-in-part of application No. 08/850,205, May 2, 1997, which is a continuation-in-part of application No. 08/829,345, Mar. 31, 1997, Pat. No. 5,800,924, which is a continuation of application No. 08/394,605, Feb. 27, 1995, Pat. No. 5,683,281.

[51] Int. Cl.$^6$ ................................................. C01G 3/00
[52] U.S. Cl. ............................ 423/23; 423/22; 428/408; 442/179
[58] Field of Search ............................ 428/408; 442/179

[56] References Cited

U.S. PATENT DOCUMENTS

| | | | |
|---|---|---|---|
| 3,174,895 | 3/1965 | Gibson et al. | 161/259 |
| 3,385,723 | 5/1968 | Pickar | 117/46 |
| 3,462,289 | 8/1969 | Rohl et al. | 117/46 |
| 3,927,157 | 12/1975 | Vasterling | 264/29 |
| 4,119,189 | 10/1978 | Ehrenreich | 192/107 |
| 4,178,413 | 12/1979 | DeMunda | 428/408 |
| 4,275,095 | 6/1981 | Warren . | |
| 4,397,901 | 8/1983 | Warren | 428/101 |
| 4,425,407 | 1/1984 | Galasso et al. | 428/368 |
| 4,465,777 | 8/1984 | Shuford | 501/88 |
| 4,472,476 | 9/1984 | Veltri et al. | 428/215 |
| 4,476,164 | 10/1984 | Veltri et al. . | |
| 4,476,178 | 10/1984 | Veltri et al. | 428/215 |
| 4,487,799 | 12/1984 | Galasso et al. | 428/334 |
| 4,500,602 | 2/1985 | Patten et al. | 428/408 |
| 4,507,272 | 3/1985 | Mullen et al. . | |
| 4,515,860 | 5/1985 | Holzl | 428/408 |
| 4,585,675 | 4/1986 | Shuford | 427/376.2 |
| 4,599,256 | 7/1986 | Vasilos | 428/114 |
| 4,671,997 | 6/1987 | Galasso et al. | 428/408 |
| 4,684,021 | 8/1987 | Niebling et al. | 206/334 |
| 4,795,677 | 1/1989 | Gray | 428/246 |
| 4,833,030 | 5/1989 | Petersen | 428/408 |
| 4,863,773 | 9/1989 | Rousseau et al. | 428/68 |
| 4,868,056 | 9/1989 | Haselkorn | 428/408 |
| 4,894,286 | 1/1990 | Gray | 428/408 |
| 4,998,879 | 3/1991 | Foster et al. | 432/253 |
| 5,132,145 | 7/1992 | Valentian | 427/249 |
| 5,207,992 | 5/1993 | Matsuo et al. | 442/249 |
| 5,281,479 | 1/1994 | Rittner et al. | 428/408 |
| 5,616,175 | 4/1997 | Walsh | 117/14 |
| 5,683,281 | 11/1997 | Metter | 442/179 |

FOREIGN PATENT DOCUMENTS

| | | |
|---|---|---|
| 290322 A1 | 11/1988 | European Pat. Off. ........ C30B 11/00 |
| 2240884 | 2/1974 | Germany . |
| 3327659A1 | 2/1985 | Germany . |
| 3328313 | 2/1985 | Germany . |
| 3820714 | 12/1989 | Germany . |
| 63112464 | 5/1988 | Japan . |
| 1264964A | 10/1989 | Japan . |
| 2197618A | 5/1988 | United Kingdom . |
| WO 91/17839 | 11/1991 | WIPO . |

OTHER PUBLICATIONS

Ceramic Coatings for Carbon–Carbon Composites by James R. Strife and James E. Sheehan, Ceramic Bulletin, vol. 67, No. 2 1988, pp. 236–274.
Brochure *Product for The Semiconductor Industry* Obtained by Applicant in May 1990. Rinsdorff–no date.
Brochure *Schunk Graphite Technology*, Schunk, 1–90 and 6–90.
Brochure *Fabmate Cage Boats*, Poco Graphite, Inc. 10–89.

*Primary Examiner*—Christopher Raimund
*Attorney, Agent, or Firm*—Renner, Kenner, Greive, Bobak, Taylor & Weber

[57] ABSTRACT

A chemical process apparatus component comprising a high purity, corrosion resistant composite including a continuous carbon fiber reinforced carbon matrix having a level of total metal impurity below about 10 ppm, preferably below about 5 ppm. Most preferably, the composite has a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn. A process utilizing at least one of the above components for use in a chemical process apparatus, wherein said component is in contact with at least one of i) a high purity material, such as for processing, and ii) a corrosive process media.

32 Claims, No Drawings

CHEMICAL PROCESS EMPLOYING CORROSION RESISTANT COMPOSITES

CROSS REFERENCE TO RELATED APPLICATIONS

The present application is a continuation-in-part of copending application U.S. Ser. No. 08/850,205, filed May 2, 1997, pending, which is a continuation in part of application U.S. Ser. No. 08/829,345 filed Mar. 31, 1997, now U.S. Pat. No. 5,800,924 issued Sep. 1, 1998, which is a continuation of U.S. Ser. No. 08/394,605 filed Feb. 27, 1995, now U.S. Pat. No. 5,683,281 issued Nov. 4, 1997.

TECHNICAL FIELD

The present invention is directed to high purity composites of carbon fiber within a carbon matrix and their preparation. More particularly, the present invention is directed to high purity composites useful as corrosion resistant components for use in, or as part of, chemical process reactors.

BACKGROUND OF THE INVENTION

The chemical process industry uses a variety of reactors for the production of various chemicals. In many instances the media in which the chemical reactions occur is highly corrosive to conventional metals. In these reactions, high temperatures are often employed in conjunction with aggressive chemical reagents such as acids or alkalis.

As an example, processing or reclaiming precious metals by extraction of the metals from various sources, using methods involving dissolution in aqua regia, is well known. The precious metal group includes silver, gold and platinum. These metals are used in a variety of high performance applications where their outstanding corrosion resistance and catalytic behavior prove useful.

Despite the history of the use of aqua regia and the effort expended in reclaiming the precious metals, severe problems are still encountered due to the difficulty in manipulating and containing this highly corrosive acid, which comprises a 3:1 or 4:1 mixture of hydrochloric and nitric acids, and which will dissolve most metals rapidly. Conventional equipment capable of handling this acid is usually made from ceramics or glass. Problems associated with poor durability and poor shock resistance frequently occur, posing severe safety hazards, and in some cases leading to significant financial losses.

Chemical reactors usually contain various plates, baffles, stirrers, trays, tubes and the like, which are usually made from steel or other metals. In certain chemical reactions, these parts have to be replaced on a frequent basis due to the high level of corrosion that takes place. Replacement of these parts means lengthy reactor downtime with serious economic consequences.

In some chemical reactor applications, graphite has found use due to its corrosion resistance. However, its widespread use is limited by its poor structural properties and overall limited durability.

There is, therefore, a need to develop chemical reactor parts that exhibit superior corrosion resistance compared to conventionally used materials such as steels, and improved structural and lifetime properties compared to graphite. Such materials must exhibit thermal and chemical stability, corrosion resistance, and must not transfer impurities to the products of the reaction, for example, to food additives, catalysts, pharmaceutical compounds and the like.

There is also a need to develop a robust, structural material that is inert to attack by aqua regia. Such a material must be capable of being fabricated into a variety of components. In addition, such a material must be highly pure so that contamination of the high value precious metals is minimized.

High temperature composite materials, in which a ceramic or carbon matrix is reinforced with a continuous fiber, find use in a variety of applications. One common application for composite materials is in aircraft brakes. In this use, the friction, or braking, material is made from a carbon matrix reinforced with carbon fibers (carbon/carbon or C/C). Such materials have high mechanical strength and are capable of operating at extreme temperatures, up to 3000° C. (in a non-oxidizing atmosphere). Composites in which both the reinforcing fiber and the matrix are ceramic find use in specialty applications such as aircraft engine parts where both strength at high temperature and low weight are needed.

Carbon/carbon based composites offer outstanding chemical resistance. This coupled with their lightweight and structural performance makes them ideal candidates for chemical processing equipment. An added advantage is that, according to the present invention, such materials can be produced at extremely high levels of purity, thus minimizing the risks of product contamination.

It is therefore an object of the present invention to provide components for use in chemical process reactors that are superior in mechanical and thermal properties to conventional graphite components.

It is a further object of the present invention to provide components for use in chemical process reactors that are superior in purity characteristics to conventional graphite components and to conventional carbon/carbon materials.

It is a further object of the present invention to provide components for use in chemical process reactors that are superior to conventional metals in corrosion resistance.

It is a further object of the present invention to provide a process for processing or reclaiming precious metals by dissolution in aqua regia, using processing components that are resistant to corrosion by aqua regia.

SUMMARY OF THE INVENTION

The present invention provides a corrosion resistant, high purity carbon/carbon composite structural material consisting of carbon fiber reinforcements within a carbon matrix. This material has outstanding thermal properties, especially in non-oxidizing atmospheres. Before the present invention, use of carbon/carbon composite materials in the chemical process industry was not known. This was due to the inability to produce materials that not only exhibit good structural and mechanical properties, but that are extremely pure and will not contaminate sensitive chemical species such as food additives, catalysts, pharmaceutical compounds and the like.

The present invention, therefore, provides a corrosion resistant, high purity composite comprising a continuous carbon fiber reinforced carbon matrix, having a total level of metal impurity below about 10 ppm, preferably below about 5 ppm, having an ultimate tensile strength of greater than about 25 ksi and a fracture toughness as measured by Izod impact of about 5 ft-lb/in.

The present invention further provides chemical processing components comprising the above corrosion resistant, high purity carbon/carbon composite, the composite including a continuous carbon fiber reinforced carbon matrix having a total level of metal impurity below about 10 ppm, preferably below about 5 ppm, having an ultimate tensile strength of greater than about 25 ksi and a fracture toughness as measured by Izod impact of about 5 ft-lb/in. Such components can be used in processes for catalyst production of fine chemicals such as catalysts, food additives, pharmaceuticals, and the like, as well as industrial chemicals.

In one embodiment, the present invention provides a chemical process reactor floor or tray comprising the corrosion resistant, high purity carbon/carbon composite material. In another embodiment, the present invention provides a reactor baffle comprising the corrosion resistant, high purity carbon/carbon material. In yet another embodiment, the present invention provides a tray of the type widely used in distillation columns, comprising the corrosion resistant, high purity carbon/carbon material.

The present invention also provides a chemical process apparatus comprising at least one corrosion resistant, high purity, carbon/carbon composite component, said high purity composite including a continuous carbon fiber reinforced carbon matrix having a total level of metal impurity below about 10 ppm, preferably below about 5 ppm, and most preferably the metal impurity being below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn. In one embodiment, the chemical process reactor vessel comprises the corrosion resistant, high purity carbon/carbon composite.

The present invention also provides a process for the production of a corrosion resistant, high purity, carbon/carbon composite comprising:

heating a carbon fiber reinforcement to at least about 2400° C., impregnating the carbon fiber with a matrix precursor of high purity carbon having less than about 10 ppm metals, carbonizing the impregnated fabric to form a carbonized part, densifying the carbonized part with high purity carbon having less than about 10 ppm metals to form a component, and heating the component at a temperature of at least about 2400° C. to form the high purity composite.

In one embodiment, densifying the carbonized part includes purging a chemical vapor deposition (CVD) processing furnace with an inert gas at a temperature of at least about 2400° C., and densifying the carbonized part with chemically vapor deposited carbon in the purged CVD furnace to form the component.

We have, therefore, found it possible to produce carbon/carbon materials with the desired mechanical, thermal, chemical and physical characteristics, that make these materials well suited for use in the chemical process industry, particularly for use as components in chemical reactors, including distillation columns, designed for the production of catalysts and other ultra pure materials and fine chemicals, as well as corrosive chemicals manufactured or processed in aggressive environments.

The present invention therefore includes a process utilizing at least one chemical processing component, wherein said component is in contact with at least one of i) a high purity material, such as for processing, and ii) a corrosive process media, wherein said component comprises a component according to the present invention, as described herein.

We have found that the carbon/carbon composites of the present invention are useful in the processing and reclamation of precious metals using aqua regia, being inert to attack by that corrosive acid.

The present invention therefore includes a process for treating precious metals including treating a material comprising at least one precious metal, wherein the at least one component of the present invention described herein is in contact with a process media comprising aqua regia.

DETAILED DESCRIPTION OF THE INVENTION

Carbon fiber reinforced carbon matrix materials, or carbon/carbon composites, have thermal stability, high resistance to thermal shock due to high thermal conductivity and low thermal expansion behavior (that is, thermal expansion coefficient or TEC), chemical resistance, and have high toughness, strength and stiffness in high-temperature applications.

Carbon/carbon composites comprise carbon reinforcements mixed or contacted with matrix precursors to form a "green" composite, which is then carbonized to form the carbon/carbon composite. They may also comprise carbon or graphite reinforcements in which the matrix is introduced fully or in part by chemical vapor infiltration (CVI).

The carbon reinforcements are commercially available from Amoco, DuPont, Hercules, and others, and can take the form of continuous fiber, cloth or fabric, yarn, and tape (unidirectional arrays of fibers). Yarns may be woven into desired shapes by braiding, knitting, or by multidirectional weaving. The yarn, cloth and/or tape may be wrapped or wound around a mandrel to form a variety of shapes and reinforcement orientations. The fibers may be wrapped in the dry state or they may be impregnated with the desired matrix precursor prior to wrapping, winding, or stacking. Such prepreg and woven structures reinforcements are commercially available from various sources, including Fiberite, Hexcel and Cytek. The reinforcements are prepared from precursors such as polyacrylonitrile (PAN), rayon or pitch. According to the preferred embodiment of the present invention, the reinforcement is in the form of continuous fibers, more preferably in the form of a woven cloth.

Matrix precursors which may be used to form carbon/carbon composites according to the present invention include liquid sources of carbon, such as phenolic resins and pitch, and gaseous sources, including hydrocarbons such as methane, ethane, propane and the like. Representative phenolics include, but are not limited to, phenolics sold under the trade designations USP 39 and 91LD, such as supplied by Ashland Chemical, and SC1008 such as supplied by Borden Chemical.

The carbon/carbon composites useful in the present invention may be fabricated by a variety of techniques. Conventionally, resin impregnated carbon fibers are autoclave- or press-molded into the desired shape on a tool or in a die. For example, lay-ups of two dimensional (2D) continuous fiber or woven fabrics may be formed on a lay-up tool in the desired shape. The molded parts are heat-treated in an inert environment to temperatures from about 700° C. to about 2900° C. in order to convert the organic phases to carbon. The carbonized parts are then densified by carbon chemical vapor infiltration (CVI) or by multiple cycle reimpregnations and carbonizations with the resins described above. Other fabrication methods include hot-pressing and the chemical vapor impregnation of dry preforms. Methods of fabrication of carbon/carbon composites which may be used according to the present invention are described in U.S. Pat. Nos. 3,174,895 and 3,462,289, which are incorporated by reference herein.

Once the general shape of the carbon/carbon composite article is fabricated, the piece can be readily machined to precise tolerances, on the order of about 0.1 mm or less. Further, because of the strength and machinability of carbon/carbon composites, in addition to the shaping possible in the initial fabrication process, carbon/carbon composites can be formed into shapes for components that are not possible with graphite, for example.

The high purity carbon/carbon composite according to the present invention has the physical properties of conventionally produced carbon/carbon composites, yet has improved corrosion resistance and purity resulting from the process for the production of the corrosion resistant, high purity carbon/carbon composite of the present invention.

After the component has been formed by the densification of the carbonized part, the component is further heat treated at 2400° C. to about 3000° C. in a non-oxidizing or inert atmosphere to ensure graphitization of the structure and to remove any impurities that may have been introduced. The period of time for this procedure is calculated based upon graphitization time/temperature kinetics, taking into account furnace thermal load and mass. The component may be machined, if desired, to precise specifications and tolerances, as discussed above.

Component purity is established by the use of high purity matrix precursors and carbon black fillers. For example, the phenolic resins used should contain less than 50 ppm metals, should utilize non-metallic accelerators for cure, and preferably should be made in a stainless steel reactor. Processing conditions in the manufacture of the carbonized parts are maintained at high standards so as not to introduce any extraneous impurities.

In the chemical vapor infiltration (CVI) of the carbonized part, precautions are taken not to introduce any elemental impurities in the CVI furnace. Prior to processing the carbonized parts, the furnace is purged by running an inert gas, such as argon, helium or nitrogen, through it for several heat treat cycles at about 2400° C. to 3000° C.

A method of producing high purity carbon/carbon composites is also described in copending U.S. Ser. No. 08/394,605, incorporated herein by reference, and commonly assigned with the present application.

We have found that the specific variants of carbon/carbon composites disclosed herein, according to the present invention, offer superior corrosion resistance compared to conventional metals and improved purity and durability compared to graphites and conventional carbon/carbon composites. A comparison of the corrosion resistance of steel as compared to carbon/carbon composites is shown in Table 1 below.

As used herein, corrosion resistance means that the material experiences negligible attack, or exhibits negligible weight loss in commonly used chemical reaction media. For example, while strong oxidizing agents, such as nitric acid, at high temperatures and high concentrations will affect the inventive carbon/carbon composites, mild oxidizing agents and all reducing agents have no effect on the material.

TABLE 1

Corrosion Resistance of Steel and C/C Composites

| Environment | Temperature (deg C.) | 316 Stainless Steel | Carbon/Carbon |
|---|---|---|---|
| Hydrochloric acid (75%) | 25 deg C. | B | A |
| Hydrochloric acid (75%) | Boiling point | B | A |

TABLE 1-continued

Corrosion Resistance of Steel and C/C Composites

| Environment | Temperature (deg C.) | 316 Stainless Steel | Carbon/Carbon |
|---|---|---|---|
| Acetic acid | 25 deg C. | B | A |
| Acetic acid | Boiling point | B | A |
| Sulfuric acid 25–75% | 130 deg C. | B | A |
| Sulfuric acid 75–100% | 80 deg C. | B | B |
| Nitric acid | Boiling point | B | B |
| Ammonia aqueous | Boiling point | B | A |

Key A = Complete resistance to attack, B = Some attack

High purity carbon/carbon composites prepared according to the present invention were analyzed by inductively coupled plasma spectroscopy (ICP) in comparison with conventional graphite components, also analyzed by atomic absorption spectroscopy (AAS), and with conventional carbon/carbon composites, analyzed by high temperature halonization. The results are shown in Table II below.

TABLE 2

Purity Levels in Graphite, Conventional C/C and C/C of the Present Invention

| Element (ppm) | Detection Limit (ICP) | Graphite | Conventional C/C | High Purity C/C |
|---|---|---|---|---|
| Aluminum | 0.1 | <0.08 | 4 | Not detected |
| Calcium | 0.1 | 0.13 | 10–30 | Not detected |
| Chromium | 0.01 | <0.07 | <0.32 | Not detected |
| Copper | 0.02 | <0.08 | <0.06 | Not detected |
| Iron | 0.04 | 0.09 | 3–5 | 0.18 |
| Magnesium | 0.02 | <0.02 | 3–5 | Not detected |
| Manganese | 0.01 | <0.08 | 0.034 | Not detected |
| Molybdenum | 0.02 | Not measured | 1.0 | Not detected |
| Nickel | 0.04 | <0.01 | Not detected | Not detected |
| Phosphorous | 0.02 | Not measured | 5.8 | Not detected |
| Potassium | 4.0 | <0.01 | Not detected | Not detected |
| Sodium | 0.2 | <0.05 | 4.8 | Not detected |
| Vanadium | 0.02 | <0.07 | Not measured | 0.24 |

As shown in Table 2, the high purity carbon/carbon composites of the present invention are below the detection limit for inductively coupled plasma spectroscopy analysis for the metals Al, Ca, Cr, Cu, K, Mg, Mn, Mo, Na, Ni, and P, while these metal impurities are shown to be present in graphite, and in conventional carbon/carbon composite materials (except in the latter, for nickel and potassium). Values reported herein that are lower than the ICP detection limit were obtained by glow discharge mass spectrometry.

Carbon/carbon composites produced according to the invention were ashed and the diluted residue further analyzed by inductively coupled plasma spectroscopy for metals content in addition to those metals tested above. As demonstrated in Table 3 below, the concentration of these metals, Ag, Ba, Be, Cd, Co, Pb, Sr, and Zn, was also below the detection limit for the analytical technique.

TABLE 3

| Element | Detection Limit (PPM) | High Purity C/C Level |
|---|---|---|
| Barium | 0.01 | Not detected |
| Beryllium | 0.01 | Not detected |
| Cadmium | 0.01 | Not detected |
| Cobalt | 0.02 | Not detected |
| Lead | 0.2 | Not detected |

TABLE 3-continued

| Element | Detection Limit (PPM) | High Purity C/C Level |
|---|---|---|
| Silver | 0.02 | Not detected |
| Strontiwn | 0.02 | Not detected |
| Zinc | 0.02 | Not detected |

Carbon/carbon composites, according to the invention, can be used in chemical processing apparatus without first coating the component, although it is preferable to precoat the carbon/carbon composite prior to use, in order to lock down any particles which may have formed as a result of the composite fabrication or machining process. Carbon/carbon composites can readily be coated with a protective coating, such as refractory carbides, refractory nitrides, and refractory borides. Preferred refractory coatings are silicon carbide, silicon nitride, boron carbide, boron nitride, pyrolytic boron nitride and silicon boride. Graded or layered coatings of the carbides, nitrides and borides may also be used. Other protective coatings which can be used to seal the carbon/carbon composite material, such as to avoid particulation, include glasses, vitreous or glassy carbon, and pyrolitic carbon.

Additionally, polymers such as fluorocarbon polymers, which are resistant to the reaction medium employed in the apparatus may also be used to coat the carbon/carbon composite components of the present invention, to prevent particulation. Examples include but are not limited to polytetrafluoroethylene, polyvinylidene fluoride, polymers of fluorinated ethylene-propylene, chlorotrifluoroethylene, hexafluoropropylene, and the like.

Advantages of carbon/carbon (C/C) composites over graphite, particularly with regard to chemical processing apparatus, arise from improved mechanical properties, namely improved strength, dimensional stability, and impact and thermal shock resistance, in part due to the incorporation of the reinforcement fibers. Representative graphite components and carbon/carbon composite components prepared according to the present invention were tested for physical, thermal and mechanical properties, the results for which are reported in Table 4.

TABLE 4

Properties of Graphite and C/C Composites of the Present Invention

| Property | Graphite | C/C Composite of the Present Invention |
|---|---|---|
| Density (g/cc) | 1.72–1.90 | 1.6–1.9 |
| Porosity (%) | 9–12 | 2–15 |
| Hardness (Shore) | 12–80 | Off scale |
| Thermal Conductivity (w/mK) | 70–130 | 8–500 |
| Thermal Exp Coeff. ($\times 10^{-6}$ in/in/deg C. | 2.0–3.6 | 1.4 (in-plane) 6.3 (cross-ply) |
| Emissivity | 0.77 | 0.6–0.7 |
| Ultimate Tensile Strength (ksi) | 0.9–1.7 | 25–50 |
| Tensile Modulus (msi) | 0.8–1.7 | 10–25 |
| Flexural Strength (ksi) | 1.7–13 | 24–44 |
| Compressive strength (ksi) | 4.4–22 | 25–30 |
| Fracture Toughness (Izod) (ft 1-lb./in) | <1 | 13 |

Although the properties in Table 4 above were tested for composites produced according to a preferred embodiment of the invention, the high purity, corrosion resistant carbon/carbon composites of the present invention can be produced to exhibit a density of about 1.6 to about 2 g/cc, and a porosity of about 2 to about 25%. These high purity composites generally range in tensile strength from about 25 to about 100 ksi, in tensile modulus up to about 30 msi, in flexural strength up to about 60 ksi, in compressive strength up to about 50 ksi, and in fractural toughness, as measured by Izod impact, from about 5 to about 25 ft-lb/in.

Such inventive high purity composites exhibit a thermal conductivity of about 20 to about 500 W/mK in plane and about 5 to about 200 W/mK cross-ply, thermal expansion coefficients of zero to about $2 \times 10^{-6}$ in/in/° C. in plane and about $6 \times 10^{-6}$ in/in/° C. to about $10 \times 10^{-6}$ in/in/° F. cross ply. Thermal emissivity of the high purity composites is about 0.4 to about 0.8. The electrical resistivity of the high purity composites is about $1 \times 10^{-4}$ to about $1 \times 10^{-2}$ ohm-cm.

According to the present invention, the high purity, corrosion resistant carbon/carbon composites are formed into components for use in chemical process reactors, such as containers, plates, baffles, spargers, stirrers, screens, trays, tubes, pipes, lines, beds, tanks, liners, shields, diffuser plates, reactor floors, and the like, as well as the reactor vessel itself. As used herein, a chemical processing "component" includes parts of a chemical processing apparatus, furniture or parts used within a chemical processing apparatus or its associated apparatus such as transport lines, distillation columns, valves, heaters, pump components, and the like, as well as all, or portions of the reactor vessel itself.

According to the invention therefore, chemical process reactor components such as diffuser plates have been fabricated, comprising a high purity, corrosion resistant composite including a carbon fiber reinforced carbon matrix having a level of total metal impurity below about 10 ppm. These diffuser plates act as supports for reactant particles within the reactor, and contain holes through which the reaction medium passes to contact the reactant particles. These and other components are preferably fabricated from composites having a total metal impurity level below about 5 ppm, and most preferably below the detection limit of inductively coupled spectroscopy for the metals Ag, Al, Ba, Be, Ca, Cd, Co, Cr, Cu, K, Mg, Mn, Mo, Na, Ni, P, Pb, Sr and Zn.

In another embodiment of the invention, a high purity carbon fiber fabric is partly densified with high purity CVD carbon in order to rigidize the fabric and to give it structural integrity, having a fabric tensile strength on the order of about 90 to about 140 ksi. The partly densified component is utilized as a mesh or screen to support catalyst particles in the reaction medium.

EXAMPLES OF THE INVENTION

The use of the corrosion resistant, high purity carbon/carbon of the present invention in chemical processing equipment or apparatus, is exemplified by the following representative applications. These examples are by no means intended to limit the scope of the present invention, but are presented for the purposes of providing examples of various types components that can be fabricated from the inventive composite material, that are common to a wide variety of chemical processes reactors. Other types of reactor components and furniture known to the skilled artisan can be fabricated from the inventive composite material described within this specification.

Example 1

Catalyst Production

Precious metal catalysts such as those disclosed in U.S. Pat. No. 4,600,571 are usually prepared by the deposition of a precious metal halide, e.g. ruthenium, onto a suitable substrate, e.g. carbon particles, followed by reduction of the metal halide to the metal. Such catalysts, for example, may be used in the production of ammonia.

Commercial processes used to manufacture such catalysts may include depositing the metal halide onto the catalyst substrate from a solution of the halide in hydrochloric acid. Such reaction usually occurs between 100 and 200° C. Stainless steel components in the catalyst reactor are known to have a limited lifetime due to severe corrosion of the steel by the metal halide/hydrochloric acid medium. Such parts have to be replaced on a regular basis, which results in undesirable reactor downtime.

In experimental trials, it has been found that whereas stainless steel is adversely affected by the acidic reaction medium of this process, the high purity, corrosion resistant carbon/carbon composite of the present invention is not. No weight loss has been observed in samples that have been immersed in the reactor during processing runs.

The use of the carbon/carbon parts according to the present invention not only provides reduced reactor downtime but installation of large parts, e.g. reactor floors, is simplified due to the much reduced weight of the component made with the inventive composite as compared to that of stainless steel. In addition, the high level of purity of the inventive carbon/carbon parts reduces the chances of contamination of the catalyst.

Example 2
Preparation of Industrial Acids

Common industrial organic acids are produced on a huge scale, with many being utilized as intermediate chemicals. Acetic acid, or acetic anhydride, for example, is used as the starting point for many industrial chemicals. Other acids, such as adipic acid, is used in the manufacture of man-made plastics such as nylon.

Common to many of these acid manufacturing methods is the need for corrosion resistant reactor internals including distillation columns and packings. Stainless steel corrodes rapidly in these environments, and as a consequence, other more exotic metals are used, such as titanium and zirconium.

Use of the inventive carbon/carbon composite components as reactor internals and distillation column interiors provides advantages in terms of increased lifetime due to the superior corrosion resistance, reduced weight and reduced cost, especially when compared to the more expensive exotic metals.

Example 3
Coal Gasification

In general, coal gasification turns high sulfur coal into low sulfur coal gas, which is subsequently burned. In one variant of the process termed "Integrated Gasification Combined Cycle", coal is turned into electricity. A gasifier produces fuel gases which are cleaned, and then burned in a gas turbine to produce electricity.

The fuel gas produced is extremely corrosive and comprises ammonia, carbon monoxide, hydrochloric acid and other corrosive substances, present in the process at temperatures up to 900° C. This fuel gas attacks most known metals, making the handling of the fuel gas and subsequent burning extremely difficult.

We have found, in experimental trial tests, that carbon/carbon composite components have proven extremely resistant to attack by such a fuel gas. High purity, corrosion resistant carbon/carbon composite components of the present invention are useful as liners or pipes for the coal gasification process.

Example 4
Precious Metal Processing and Reclamation with Aqua Regia

Samples of carbon/carbon composites according to the present invention were immersed in aqua regia at 95° C. for 10 days. After each day, the samples were removed, dried and weighed. After the 10 days, the immersed samples were analyzed for changes in properties. Results are shown in Table 5 below, together with comments on the observations made during the analysis.

TABLE 5

Comparison of the Properties of Inventive Carbon/Carbon Composites Treated and Untreated with Aqua Regia at 95° C. for 10 Days

| Test | C/C Treated with Aqua Regia | Untreated C/C Control Sample | Comments and Observations |
| --- | --- | --- | --- |
| Weight Loss | No measurable weight loss | | No apparent chemical attack |
| Density | 1.72 g/cc | 1.72 g/cc | No change in structure |
| Tensile Strength | 49.3 ksi | 47.7 ksi | No chemical attack on the carbon fiber |
| Tensile Modulus | 11.3 msi | 11.8 msi | No chemical attack on the carbon fiber |
| Interlaminar Shear Strength | 1794 psi | 1706 psi | No chemical attack on the carbon fiber:carbon matrix bond |
| Microstructure by Scanning Electron Microscopy | Similar structure to the untreated control sample | | No evidence of chemical attack on surfaces or interfaces of the composite |

The combination of the structural properties of carbon/carbon composites of the present invention, together with their excellent resistance to attack by aqua regia, makes it is possible to fabricate and use a variety of components that are useful in precious metal processing. These include but are not limited to containers, reactors, tubes, plates, baffles, spargers, stirrers, screens, trays, pipes, lines, valves, beds, tanks, liners, shields, diffuser plates, reactor floors and the like. In addition, the high purity afforded by the carbon/carbon composites of the present invention means that product contamination is minimized. This is of critical importance in the processing of highly pure and very high value precious metals.

Other examples of chemical processes in which carbon/carbon composite components of the present invention are advantageously utilized are those in which the component is to be exposed to a fluid of controlled purity and/or a fluid which is corrosive to metal. Examples include, but are not limited to processes for the producing or utilizing organic or inorganic acids or bases (alkalis), peroxides, mild oxidation agents or reducing agents, corrosive monomers for polymerization such as vinylidene chloride, and the like.

The following advantages have been realized using the high purity, corrosion resistant composite components of the present invention in chemical processing apparatus. The improved corrosion resistance as compared to metals, as well as the durability of the high purity carbon/carbon composite components, results in a reduction in reactor downtime and in some instances, reactor rebuild. The durability of the high purity carbon/carbon composite components is due to their superior thermal and mechanical properties. The high purity composites are also resistant to thermal shock and heat/cool cycles, offering an improvement over conventional graphite components. Other advantageous thermal characteristics are listed in Table 4, above.

An additional and unexpected benefit from the use of the high purity carbon/carbon composite components over graphite concerned the production of large components. The fabrication of large graphite parts is difficult due to graphite's low mechanical properties (e.g. flexural strength) and graphite's inability to support its own weight. On the other hand large parts were able to be made from high purity carbon/carbon composites with ease, for example, up to 48 inches in diameter. Further, the ease of fabrication of the high purity carbon/carbon composite materials prior to carbonization, and their machinability after carbonization, permits the fabricating the furnace components into any desired configuration.

Therefore, the objects of the present invention are accomplished by the production and use of high purity, corrosion resistant carbon/carbon composite components for use in chemical processing. The corrosion resistance advantage of the inventive material with respect to metals such as steel, mechanical and purity advantages of the inventive material with respect to graphite, and the purity advantages of the inventive material with respect to graphite and conventional carbon/carbon composites has been demonstrated, as is shown above. It should be understood that the present invention is not limited to the specific embodiments described above, but includes the variations, modifications and equivalent embodiments that are defined by the following claims.

We claim:

1. A process utilizing at least one chemical processing component, wherein said process comprises contacting the component with at least one of i) a high purity material, and ii) a corrosive media, wherein said component comprises a high purity, corrosion resistant composite including a continuous carbon fiber reinforced carbon matrix having a level of total metal impurity below about 10 ppm, having an ultimate tensile strength of greater than about 25 ksi and a fracture toughness as measured by Izod impact of at least about 5 ft-lb/in.

2. The process of claim 1, including treating a material containing at least one precious metal, wherein the component is in contact with a process media comprising aqua regia.

3. The process of claim 2, wherein the precious metal is selected from the group consisting of silver, gold, and platinum.

4. The process of claim 2, wherein said treating is selected from processing and reclaiming the precious metal.

5. The process of claim 2, wherein the component is selected from the group consisting of containers, reactors, tubes, plates, baffles, spargers, stirrers, screens, trays, pipes, lines, valves, beds, tanks, liners, shields, diffuser plates, reactor floors, distillation columns, heaters, pump components, and combinations thereof.

6. The process of claim 1, wherein the component is in contact with a fine chemical.

7. The process of claim 6 wherein the fine chemical is a pharmaceutical.

8. The process of claim 6 wherein the fine chemical is a catalyst.

9. The process of claim 1 wherein the fine chemical is a food additive.

10. The process of claim 1, wherein the component is in contact with a fluid corrosive to metal.

11. The process of claim 10, wherein the component is in contact with a corrosive process media selected from the group consisting of acid, acid anhydride, base, peroxide, reducing agent, mild oxidation agent, and polymerization monomer.

12. The process of claim 10, wherein the component is in contact with fuel gas.

13. The process of claim 1 wherein the composite has a level of total metal impurity below about 5 ppm.

14. The process of claim 1 wherein the composite has a level of metal impurity below the detection limit of inductively coupled plasma spectroscopy for the metals Ag, Al, Ba, Be, Ca, Cd, Co, Cr, Cu, K, Mg, Mn, Mo, Na, Ni, P, Pb, Sr and Zn.

15. The process of claim 1 wherein the carbon fiber is selected from the group consisting of fiber, cloth, woven fabric, yarn, and tape.

16. The process of claim 1 wherein the carbon fiber is woven fabric.

17. The process of claim 1 wherein the carbon matrix comprises carbonized high purity carbon matrix precursors, wherein the precursor contains less than about 50 ppm metals.

18. The process of claim 17 wherein the carbon matrix precursor is a gaseous hydrocarbon.

19. The process of claim 1 wherein the carbon matrix comprises carbonized high purity phenolic resin.

20. The process of claim 1 wherein the carbon matrix comprises carbonized high purity pitch.

21. The process of claim 1 wherein the component has an ultimate tensile strength of about 25 to about 100 ksi and a tensile modulus of about 10 to about 30 msi.

22. The process of claim 1 wherein the component has an ultimate tensile strength of about 25 to about 50 ksi and a tensile modulus of about 10 to about 25 msi.

23. The process of claim 1 wherein the component has a flexural strength of about 24 to about 60 ksi and a compressive strength of about 25 to about 50 ksi.

24. The process of claim 1 wherein the component has a flexural strength of about 24 to about 44 ksi and a compressive strength of about 25 to about 30 ksi.

25. The process of claim 1 wherein the component has a fracture toughness as measured by Izod impact of about 13 to about 25 ft lb/in.

26. The process of claim 1 wherein the component has an in plane thermal expansion coefficient of zero to about $2 \times 10^{-6}$ in/in/deg C and a cross-ply thermal expansion coefficient of about 6 to about $10 \times 10^{-6}$ in/in/deg C.

27. The process of claim 1 wherein the component has an in-plane thermal conductivity of about 20 to about 500 W/mK and a cross-ply thermal conductivity of about 5 to about 200 W/mK.

28. The process of claim 1 wherein the component has a thermal emissivity of about 0.4 to about 0.8.

29. The process of claim 1 wherein the component has a coating selected from the group consisting of pyrolitic carbon, glasses, resistant polymers, carbides, nitrides, and borides.

30. The process of claim 1 wherein the component has a coating selected from the group consisting of silicon carbide, silicon nitride, silicon boride, boron carbide, boron nitride, pyrolytic boron nitride pyrolitic carbon, vitreous carbon, and fluorocarbon polymer.

31. The process of claim 1 wherein the component has an electrical resistivity of about $1 \times 10^{-4}$ to about $1 \times 10^{-2}$ ohm-cm.

32. A process utilizing a chemical process support component, said process comprising contacting the component with a reaction medium, wherein said component comprises a high purity, corrosion resistant continuous carbon fiber woven fabric, partly densified with high purity CVD carbon sufficient to rigidize the fabric and to provide structural integrity to the resulting composite material, wherein the composite material has a level of total metal impurity below about 10 ppm, and a fabric tensile strength greater than about 90 ksi.

* * * * *